US012723181B2

(12) United States Patent
Takasaki et al.

(10) Patent No.: US 12,723,181 B2
(45) **Date of Patent: *Sep. 1, 2026**

(54) COPOLYMER, DISPERSANT, AND RESIN COMPOSITION

(71) Applicant: Denka Company Limited, Tokyo (JP)

(72) Inventors: Ippei Takasaki, Tokyo (JP); Kazuyuki Igarashi, Tokyo (JP); Tomoyuki Kanai, Tokyo (JP); Yukihiko Yamashita, Tokyo (JP)

(73) Assignee: Denka Company Limited, Tokyo (JP)

( * ) Notice: Subject to any disclaimer, the term of this patent is extended or adjusted under 35 U.S.C. 154(b) by 870 days.

This patent is subject to a terminal disclaimer.

(21) Appl. No.: 17/602,545

(22) PCT Filed: Apr. 7, 2020

(86) PCT No.: PCT/JP2020/015719

§ 371 (c)(1),
(2) Date: Oct. 8, 2021

(87) PCT Pub. No.: WO2020/209263

PCT Pub. Date: Oct. 15, 2020

(65) Prior Publication Data

US 2022/0186089 A1 Jun. 16, 2022

(30) Foreign Application Priority Data

Apr. 11, 2019 (JP) ................................ 2019-075793

(51) Int. Cl.
*C09J 11/08* (2006.01)
*C08F 220/18* (2006.01)
(Continued)

(52) U.S. Cl.
CPC ......... *C09J 11/08* (2013.01); *C08F 220/1804* (2020.02); *C08F 283/065* (2013.01);
(Continued)

(58) Field of Classification Search
CPC ..... C09J 11/08; C09J 9/02; C09J 11/04; C09J 133/10; C08F 220/1804; C08F 283/065;
(Continued)

(56) References Cited

U.S. PATENT DOCUMENTS

2007/0021313 A1 1/2007 Hattori et al.
2013/0248755 A1 9/2013 Dohmoto et al.
(Continued)

FOREIGN PATENT DOCUMENTS

JP 2002146155 A * 5/2002
JP 2002-256030 A 9/2002
(Continued)

OTHER PUBLICATIONS

"Carboxylic Acid Structure and Chemistry: Part 1", Principles of Drug Action 1, 2005. (Year: 2005).*
(Continued)

*Primary Examiner* — Angela C Brown-Pettigrew
*Assistant Examiner* — Jiajia Janie Cai
(74) *Attorney, Agent, or Firm* — Foley & Lardner LLP

(57) ABSTRACT

Disclosed is the copolymer having a (meth)acrylic monomer unit A having an anionic group, a (meth)acrylic monomer unit B having a cationic group, and a (meth)acrylic monomer unit C other than the (meth)acrylic monomer unit A and the (meth)acrylic monomer unit B.

19 Claims, 3 Drawing Sheets

(51) Int. Cl.

| | |
|---|---|
| ***C08F 283/06*** | (2006.01) |
| ***C08F 283/12*** | (2006.01) |
| ***C08J 3/22*** | (2006.01) |
| ***C09J 9/02*** | (2006.01) |
| ***C09J 11/04*** | (2006.01) |
| ***C09J 133/10*** | (2006.01) |
| ***C09K 5/14*** | (2006.01) |
| ***H05K 7/20*** | (2006.01) |

(52) U.S. Cl.
CPC ............ *C08F 283/124* (2013.01); *C08J 3/22* (2013.01); *C09J 9/02* (2013.01); *C09J 11/04* (2013.01); *C09J 133/10* (2013.01); *C09K 5/14* (2013.01); *H05K 7/2039* (2013.01)

(58) Field of Classification Search
CPC .......... C08F 283/124; C08J 3/22; C09K 5/14; H05K 7/2039
See application file for complete search history.

(56) References Cited

U.S. PATENT DOCUMENTS

| | | | | |
|---|---|---|---|---|
| 2014/0248504 | A1* | 9/2014 | Song | B32B 25/14 524/404 |
| 2018/0179383 | A1* | 6/2018 | Minorikawa | C08L 83/04 |
| 2022/0186089 | A1 | 6/2022 | Takasaki et al. | |

FOREIGN PATENT DOCUMENTS

| | | | | |
|---|---|---|---|---|
| JP | 2005-206833 | A | | 8/2005 |
| JP | 2009-173752 | A | | 8/2009 |
| JP | 2012-251156 | A | | 12/2012 |
| JP | 2016121350 | A | * | 7/2016 |
| JP | 2016216523 | A | * | 12/2016 |
| JP | 2018-062552 | A | | 4/2018 |
| WO | WO-2012/067247 | A | | 5/2012 |
| WO | WO-2018/033992 | A1 | | 2/2018 |
| WO | WO-2020/209263 | A1 | | 10/2020 |

OTHER PUBLICATIONS

JP2002146155 translation. (Year: 2002).*
JP2016121350 translation. (Year: 2016).*
JP2016216523 translation. (Year: 2016).*
JP 2002146155 A translation. (Year: 2002).*
"Silaplane® FM-0711 information", 2025. (Year: 2025).*
JP2016121350 A translation. (Year: 2016).*

* cited by examiner

COPOLYMER, DISPERSANT, AND RESIN COMPOSITION

CROSS-REFERENCE TO RELATED APPLICATIONS

This application is the U.S. National Stage of PCT/JP2020/015719, filed Apr. 7, 2020, which claims priority to JP 2019-075793, filed Apr. 11, 2019.

TECHNICAL FIELD

The present invention relates to a copolymer, a dispersant, and a resin composition.

BACKGROUND ART

In recent years, motor vehicles such as electric vehicles have been spreading. A circuit board used for an in-vehicle power supply system of a motor vehicle generally has high voltage and current, and thus an amount of heat generation increases. When an amount of heat generation increases, malfunctions and failures of a circuit are caused. Additionally, a battery pack which supplies electricity to an electric motor of a motor vehicle generates heat by repeating charge and discharge. Continuous use at a high temperature will be a cause to reduce performance and life of a battery pack.

The issue regarding such a heat generation has also been occurring in electronic devices in addition to motor vehicles. Heat generation density inside an electronic device, that has been higher performed and downsized, is increasing every year, thereby posing a problem of how efficiently radiating the heat to be generated when using.

Details of the cooling mechanism varies according to heat generation parts, but basically a method is employed in which a heat generation part and a cooling member are allowed to be in contact thereby removing the heat. At this time, a gap, if any, present between the heat generation part and the cooling member reduces heat removal efficiency, and thus the heat removal is generally carried out by indirectly allowing a heat generation part and a cooling member to be in contact via a heat radiation member.

Such a heat radiation member includes, generally in a resin, an inorganic filler surface treated by a silane coupling agent and the like. A surface treatment agent other than a silane coupling agent which has been known is, for example, a copolymer including a polybutadiene constitutional unit, a constitutional unit having a hydrolyzable silyl group, and a constitutional unit having a polysiloxane skeleton (for example, see Patent Literature 1).

CITATION LIST

Patent Literature

Patent Literature 1
Japanese Patent Laid-Open No. 2018-062552

SUMMARY OF INVENTION

Technical Problem

However, when a heat radiation member which uses the conventional surface treatment agent and a dispersant is retained for an extended period of time at a high temperature, a problem has been revealed in that distribution rupture is caused and an inorganic filler re-agglomerates. When the inorganic filler in a heat radiation member re-agglomerates, the hardness of the heat radiation member increases, likely causing cracks and the like. Such a damage of a heat radiation member induces the reduction in reliability of motor vehicles and the like.

The present invention was made in light of the above problems and aims to provide a copolymer capable of maintaining the dispersibility even when retained for an extended period of time in a state of high temperature, as well as a dispersant, a resin composition and the like including the copolymer, and further thermally conductive grease using the resin composition and the like and a heat radiation member using the thermally conductive grease.

Solution to Problem

The present inventors conducted extensive studies to solve the above problems. As a result, a (meth)acrylic copolymer having a predetermined constitutional unit can solve the above problems, whereby the present invention has been accomplished.

More specifically, the present invention is as follows.

[1]

A copolymer comprising:

a (meth)acrylic monomer unit A having an anionic group, a (meth)acrylic monomer unit B having a cationic group, and a (meth)acrylic monomer unit C other than the (meth)acrylic monomer unit A and the (meth)acrylic monomer unit B.

[2]

The copolymer according to [1], wherein the anionic group comprises one or more selected from the group consisting of carboxyl groups, phosphate groups, and phenolic hydroxyl groups.

[3]

The copolymer according to [1] or [2], wherein the (meth)acrylic monomer unit A further comprises an electron-withdrawing group bound to the anionic group.

[4]

The copolymer according to any one of [1] to [3], wherein the cationic group comprises one or more selected from the group consisting of primary amino groups, secondary amino groups, tertiary amino groups, and quaternary ammonium salts.

[5]

The copolymer according to any one of [1] to [4], wherein the (meth)acrylic monomer unit B further comprises an electron-donating group bound to the cationic group.

[6]

The copolymer according to any one of [1] to [5], wherein the (meth)acrylic monomer unit C comprises one or more selected from the group consisting of oxyalkylene skeletons, siloxane skeletons, hydrocarbon skeletons, and phosphodiester skeletons.

[7]

The copolymer according to any one of [1] to [6], wherein a weight average molecular weight is 5,000 to 500,000.

[8]

The copolymer according to any one of [1] to [7], wherein a total content of the (meth)acrylic monomer unit A and the (meth)acrylic monomer unit B is 0.05 to 90 mol % based on a total 100 mol % of the (meth)acrylic monomer unit A, the (meth)acrylic monomer unit B, and the (meth)acrylic monomer unit C.

[9]

The copolymer according to any one of [1] to [8], wherein a content of the (meth)acrylic monomer unit A is 0.03 to 70 mol % based on a total 100 mol % of the (meth)acrylic monomer unit A, the (meth)acrylic monomer unit B, and the (meth)acrylic monomer unit C.

[10]

The copolymer according to any one of [1] to [9], wherein a content of the (meth)acrylic monomer unit B is 0.02 to 20 mol % based on a total 100 mol % of the (meth)acrylic monomer unit A, the (meth)acrylic monomer unit B, and the (meth)acrylic monomer unit C.

[11]

The copolymer according to any one of [1] to [10], wherein a content of the (meth)acrylic monomer unit C is 10 to 99.8 mol % based on a total 100 mol % of the (meth) acrylic monomer unit A, the (meth)acrylic monomer unit B, and the (meth)acrylic monomer unit C.

[12]

The copolymer according to any one of [1] to [11], wherein a molar ratio of the (meth)acrylic monomer unit A to the (meth)acrylic monomer unit B is 0.9 to 30.

[13]

A dispersant comprising the copolymer according to any one of [1] to [12].

[14]

A surface treatment agent comprising the copolymer according to any one of [1] to [12].

[15]

A dispersion comprising the copolymer according to any one of [1] to [12] and an inorganic filler.

[16]

A resin composition comprising a resin, the copolymer according to any one of [1] to [12], and an inorganic filler.

[17]

The resin composition according to [16], wherein the inorganic filler has conductivity and/or thermal conductive property.

[18]

The resin composition according to [16] or [17], wherein the inorganic filler is one or more selected from the group consisting of boron nitride powders, aluminum nitride powders, aluminum oxide powders, silicon nitride powders, silicon oxide powders, magnesium oxide powders, metal aluminum powders, and zinc oxide powders.

[19]

The resin composition according to any one of [16] to [18], wherein the resin comprises one or more selected from the group consisting of silicone resins, acrylic resins, and epoxy resins.

[20]

A thermally conductive grease comprising the resin composition according to any one of [16] to [19]. [21]

A heat radiation member comprising the thermally conductive grease according to [20], an electronic component, and a heat sink, wherein the electronic component and the heat sink are bonded via the thermally conductive grease.

Advantageous Effects of Invention

The present invention can accordingly provide a copolymer capable of maintaining the dispersibility even when retained for an extended period of time in a state of high temperature, as well as a dispersant, a resin composition and the like including the copolymer, and further thermally conductive grease using the resin composition and the like and a heat radiation member using the thermally conductive grease.

DESCRIPTION OF EMBODIMENTS

Figure 1:
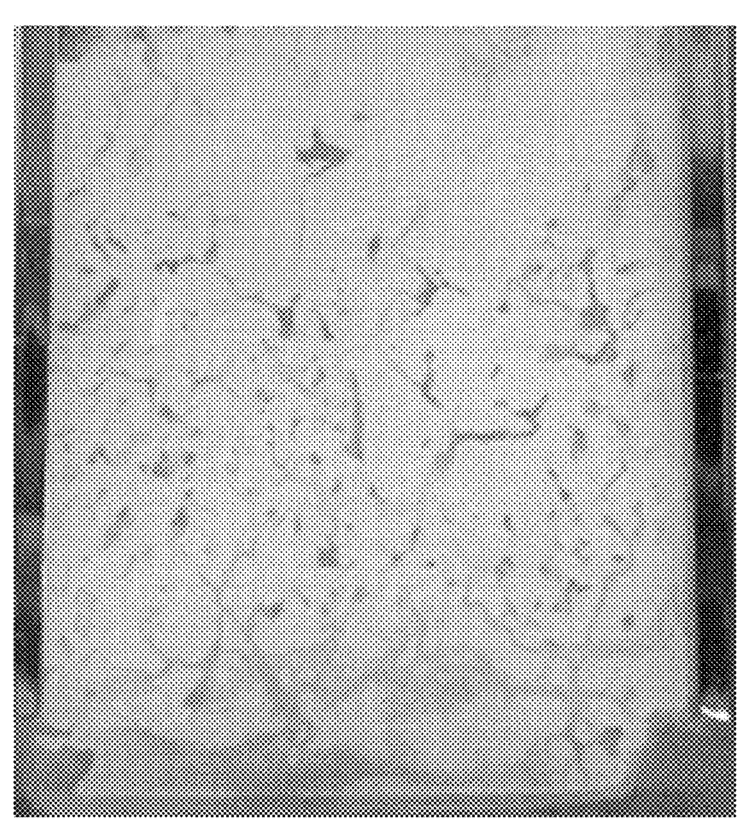
FIG. 1 is a photograph showing a test piece after the crack resistance evaluation test of Comparative Example 3.

Hereinafter, embodiments of the present invention (hereinafter, referred to as "the present embodiment") will be described in detail but the present invention is not limited thereto and numerous alterations can be employed without departing from the scope of the disclosed subject matter. Note that the (meth)acrylic monomer unit of the present invention means both a methacrylic acid monomer unit and an acrylic monomer unit.

[Copolymer]

The copolymer of the present embodiment has a (meth) acrylic monomer unit A having an anionic group, a (meth) acrylic monomer unit B having a cationic group, and a (meth)acrylic monomer unit C other than the (meth)acrylic monomer unit A and the (meth)acrylic monomer unit B. The copolymer of the present embodiment can maintain the dispersibility even when retained for an extended period of time in a state of high temperature because of the above constitution. The reason therefor is considered as below but not limited thereto.

A predetermined potential difference is caused at an interface where two different substances are in contact as in the surface of a dispersoid dispersed in a disperse medium, and counter ions are attracted, whereby an electrical double layer consisting of a stationary phase and a diffuse double layer is formed. The spread of counter ions at the surface of a dispersoid is also called the thickness of an electrical double layer. When dispersoid particles come closer to each other, counter ions overlap thereby increasing the force of repulsion. The copolymer of the present embodiment having both anionic groups and cationic groups in a molecule is considered to have an action for increasing the thickness of this electrical double layer. More specifically, one of the anionic group and the cationic group of the copolymer is placed close to the surface of the dispersoid as the counter ion. The other group which does not function as the counter ion (subion) is placed farther than the surface of the dispersoid at which a subion layer can further be formed. The thus increased thickness of an electrical double layer at the surface of inorganic fillers can apply electrostatic repulsion at a farther distance from the surface of the dispersoid where the Van der Waals force acts, whereby the copolymer is considered to be capable of well maintaining the dispersibility of the dispersoid even when retained for an extended period of time in a state of high temperature.

In the present embodiment, the "monomer" refers to a monomer having a polymerizable unsaturated bond before polymerization, the "monomer unit" refers to a repeating unit constituting a part of the copolymer after polymerization and derived from a predetermined monomer. Hereinafter, the "(meth)acrylic monomer unit A" is also simply called the "unit A."

((Meth)Acrylic Monomer Unit A Having an Anionic Group)

The (meth)acrylic monomer unit A is a repeating unit having an anionic group. The anionic group is not particularly limited, and examples thereof include carboxyl groups, phosphate groups, phenolic hydroxyl groups, and sulfonate groups. Of these, one or more selected from the group consisting of carboxyl groups, phosphate groups, and phenolic hydroxyl groups are preferable. With such a group, the dispersibility of the dispersoid tends to be more improved.

The unit A further preferably has an electron-withdrawing group bound to the anionic group. Such an electron-withdrawing group is not particularly limited as long as it has an action for stabilizing the anion of the anionic group. For example, usable is an acrylic monomer including an electron-withdrawing substituent such as halogen in the α-position of the carbon atom of a carboxyl group. With such a group, the dispersibility of the dispersoid tends to be more improved.

The unit A preferably has no electron-donating group bound to the anionic group or has a low electron-donating group. Such an electron-donating group is not particularly limited as long as it has an action for destabilizing the anion of the anionic group. For example, usable is an acrylic monomer including no electron-donating substituent such as a methyl group in the α-position of the carbon atom of a carboxyl group. With such a structure, the dispersibility of the dispersoid tends to be more improved.

Such a (meth)acrylic monomer is not particularly limited, and examples thereof include acrylic acid, methacrylic acid, acid phosphoxypropyl methacrylate, acid phosphoxypolyoxyethylene glycol monomethacrylate, acid phosphoxypolyoxypropylene glycol monomethacrylate, phosphoric acid-modified epoxy acrylate, 2-acryloyloxyethyl phosphate, 2-methacryloyloxyethyl acid phosphate, 4-hydroxyphenyl acrylate, 4-hydroxyphenyl methacrylate, 2-methacryloyloxyethyl succinic acid, and 2-acrylamido-2-methylpropanesulfonic acid. Of these, acrylic acid, 2-methacryloyloxyethyl phosphate, 4-hydroxyphenyl methacrylate, and 2-acrylamido-2-methylpropanesulfonic acid are preferable, with acrylic acid being more preferable. With the inclusion of the unit derived from these monomers, the affinity to the dispersoid is more improved, and the dispersibility of the dispersoid tends to be more improved. The unit A can be used singly, or two or more can be used in combination.

((Meth)Acrylic Monomer Unit B Having a Cationic Group)

The (meth)acrylic monomer unit B is a repeating unit having a cationic group. The cationic group is not particularly limited and is preferably, for example, one or more selected from the group consisting of primary amino groups, secondary amino groups, tertiary amino groups, and quaternary ammonium salts. Of these, tertiary amino groups are more preferable. With such a group, the dispersibility of the dispersoid tends to be improved.

The unit B further preferably has an electron-donating group bound to the cationic group. Such an electron-donating group is not particularly limited as long as it has an action for stabilizing the cation of the cationic group. For example, usable is an acrylic monomer including an electron-donating substituent such as a methyl group in the α-position of the carbon atom of an amino group. With such a group, the dispersibility of the dispersoid tends to be more improved.

The unit B preferably has no electron-withdrawing group bound to the cationic group or has a low electron-withdrawing group. Such an electron-withdrawing group is not particularly limited as long as it has an action for destabilizing the cation of the cationic group. For example, usable is an acrylic monomer including no electron-withdrawing substitute such as a carboxyl group in the α-position of the carbon atom of an amino group. With such a structure, the dispersibility of the dispersoid tends to be more improved.

Such a (meth)acrylic monomer is not particularly limited, and examples thereof include 1-aminoethyl acrylate, 1-aminopropyl acrylate, 1-aminoethyl methacrylate, 1-aminopropyl methacrylate, dimethylaminoethyl methacrylate, diethylaminoethyl methacrylate, t-butylaminoethyl (meth)acrylate, dimethylaminoethyl methacrylate quaternary salts, 1,2,2,6,6-pentamethyl-4-piperidyl methacrylate, 2,2,6,6-tetramethyl-4-piperidyl methacrylate, and dimethylamino ethylacrylate benzyl chloride quaternary salts. Of these, 1,2,2,6,6-pentamethyl-4-piperidyl methacrylate and 2,2,6,6-tetramethyl-4-piperidyl methacrylate are preferable, with 1,2,2,6,6-pentamethyl-4-piperidyl methacrylate being more preferable. With the inclusion of the unit derived from these monomers, the affinity to the dispersoid is more improved, and the dispersibility of the dispersoid tends to be more improved. The unit B can be used singly, or two or more can be used in combination.

((Meth)Acrylic Monomer Unit C)

The (meth)acrylic monomer unit C is a (meth)acrylic monomer unit other than the unit A and the unit B and is a (meth)acrylic monomer including no cationic group or anionic group in a molecule.

Given that the copolymer of the present embodiment is mixed with a resin composition including a thermoplastic resin or a thermosetting resin, the (meth)acrylic monomer C preferably has a skeleton with high affinity or compatibility with the resin used in the resin composition. Such a skeleton is not particularly limited, and examples thereof include the amphiphilic skeletons such as oxyalkylene skeletons, siloxane skeletons such as dimethyl siloxane, hydrophobic skeletons such as hydrocarbon skeletons such as alkyl and aryl and hydrophilic skeletons such as phosphodiester skeletons. Of these, oxyalkylene skeletons, siloxane skeletons, and hydrocarbon skeletons are preferable, with siloxane skeletons and hydrocarbon skeletons being more preferable. With such a skeleton, the compatibility with a resin to be disperse medium is more improved, and the dispersibility of the dispersoid in the resin composition tends to be more improved.

Such a (meth)acrylic monomer is not particularly limited, and examples thereof include (meth)acrylic monomers having the oxyalkylene skeleton such as ethoxycarbonylmethyl (meth)acrylate, phenol ethylene oxide-modified (meth)acrylate, phenol(ethyleneoxide 2 mol-modified) (meth)acrylate, phenol(ethyleneoxide 4 mol-modified) (meth)acrylate, paracumyl phenol ethylene oxide-modified (meth)acrylate, nonylphenol ethylene oxide-modified (meth)acrylate, nonylphenol(ethyleneoxide 4 mol-modified) (meth)acrylate, nonylphenol(ethyleneoxide 8 mol-modified) (meth)acrylate, nonylphenol(propyleneoxide 2.5 mol-modified) acrylate, 2-ethylhexylcarbitol (meth)acrylate, ethylene oxide-modified phthalic acid (meth)acrylate, ethylene oxide-modified succinic acid (meth)acrylate, and tetrahydrofurfuryl (meth)acrylate; (meth)acrylic monomers wherein an ester moiety has the hydrocarbon skeleton such as methyl (meth)acrylate, ethyl (meth)acrylate, propyl (meth)acrylate, butyl (meth)acrylate, 2-ethylhexyl (meth)acrylate, isooctyl (meth)acrylate, isodecyl (meth)acrylate, lauryl (meth)acrylate, stearyl (meth)acrylate, phenyl (meth)acrylate, cyclohexyl (meth)acrylate, dicyclopentanyl (meth)acrylate, dicyclopentenyl (meth)acrylate, dicyclopentenyloxyethyl (meth)acrylate, isobornyl (meth)acrylate, and methoxylated cyclododecatriene (meth)acrylate; (meth)acrylic monomers having a hydroxyl group such as 2-hydroxyethyl (meth)acrylate, 2-hydroxypropyl (meth)acrylate, 3-hydroxypropyl (meth) acrylate, 4-hydroxybutyl (meth)acrylate, 2-hydroxy-3-phenoxypropyl (meth)acrylate, and 3-chloro-2-hydroxypropyl (meth)acrylate; (meth)acrylic monomers having an amide bond such as N,N-dimethyl (meth)acrylamide, N,N-diethyl (meth)acrylamide, N-isopropyl (meth)acrylamide, diacetone (meth)acrylamide, and acryloylmorpholine; (meth)acrylic monomers having the siloxane skeleton such as α-butyl-ω-(3-methacryloxypropyl)polydimethylsiloxane; (meth) acrylic monomers having the phosphodiester skeleton such as (meth)acryloyloxyethyl dialkylphosphate; polyfunctional (meth)acrylic monomers such as 1,3-butylene glycol di(meth)acrylate, 1,4-butanediol di(meth)acrylate, 1,6-hexadiol di(meth)acrylate, 1,9-nonanediol di(meth)acrylate, neopentyl glycol di(meth)acrylate, dicyclopentanyl di(meth)acrylate, 2-ethyl-2-butyl-propanediol (meth)acrylate, neopentyl glycol-modified trimethylolpropane di(meth)acrylate, stearic acid-modified pentaerythritol di(meth)acrylate, 2-(1, 2-cyclohexacarboxyimide)ethyl (meth)acrylate, hexanediol di(meth)acrylate, and polyfunctional (meth)acrylate having the bisphenol structure. The unit C can be used singly, or two or more can be used in combination.

The weight average molecular weight of the (meth)acrylic monomer C is preferably 300 to 20000, more preferably 1000 to 15000, and further preferably 3000 to 12500. When a weight average molecular weight of the (meth)acrylic monomer C is 300 or more, the affinity to the disperse medium is more improved, and the dispersibility of the dispersoid tends to be more improved. When a weight average molecular weight of the (meth)acrylic monomer C is 20000 or less, the viscosity of the composition obtained when the copolymer is mixed with other resins and other ingredients more reduces, and the handleability tends to be more improved.

The total content of the unit A and the unit B is, based on the total 100 mol % of the unit A, the unit B, and the unit C, preferably 0.05 to 90 mol %, and more preferably 0.2 to 70 mol %. When the total content of the unit A and the unit B is 0.05 mol % or more, the affinity to the disperse medium is more improved, and the dispersibility of the dispersoid tends to be more improved. When the total content of the unit A and the unit B is 90 mol % or less, the viscosity of the composition obtained when the copolymer is mixed with other resins and other ingredients more reduces, and the handleability tends to be more improved.

The content of the unit A is, based on the total 100 mol % of the unit A, the unit B, and the unit C, preferably 0.03 to 70 mol %, and more preferably 0.1 to 15 mol %. When a content of the unit A is 0.03 mol % or more, the affinity to the disperse medium is more improved, and the dispersibility of the dispersoid tends to be more improved. When a content of the unit A is 70 mol % or less, the viscosity of the composition obtained when the copolymer is mixed with other resins and other ingredients more reduces, and the handleability tends to be more improved.

The molar ratio of the unit A to the unit B is preferably 0.01 to 200, preferably 0.9 to 30, and more preferably 1.0 to 10. When a molar ratio of the unit A to the unit B is within the above range, the affinity to the disperse medium is more improved, and the dispersibility of the dispersoid tends to be more improved.

The content of the unit B is, based on the total 100 mol % of the unit A, the unit B, and the unit C, preferably 0.02 to 20 mol %, and more preferably 0.1 to 5 mol %. When a content of the unit B is 0.02 mol % or more, the affinity to the filler becomes good. When such a content is 20 mol % or less, the handleability derived from the viscosity of the copolymer becomes good.

The content of the unit C is, based on the total 100 mol % of the unit A, the unit B, and the unit C, preferably 10 to 99.8 mol %, and more preferably 30 to 99 mol %. When a content of the unit C is 10 mol % or more, the handleability derived from the viscosity of the copolymer becomes good. When such a content is 99 mol % or less, the affinity to the filler becomes good.

The weight average molecular weight of the copolymer is preferably 5,000 to 500,000, and more preferably 7,000 to 100,000. When a weight average molecular weight of the copolymer is 5,000 or more, the copolymer can maintain the dispersibility even when retained for an extended period of time in a state of high temperature, and the increase in hardness of the composition can be inhibited. When a weight average molecular weight of the copolymer is 5,000 or more, the shape retentivity of the composition when blended with the inorganic filler and resins is improved, and the resistance against slipping and dripping of the composition becomes good when coated on a slanting surface or perpendicular surface. When a weight average molecular weight of the copolymer is 500,000 or less, the viscosity of the composition obtained when the copolymer is mixed with other resins and other ingredients more reduces, and the handleability tends to be more improved. The weight average molecular weight can be determined by GPC (gel permeation chromatography).

[Production Method of the Copolymer]

The method for producing the copolymer of the present embodiment is not particularly limited, and a known polymerization method for a (meth)acrylic monomer can be used. Examples of the polymerization method include radical polymerizations and anionic polymerizations. Of these, radical polymerizations are preferable.

The thermal polymerization initiator used for the radical polymerization is not particularly limited, and examples thereof include azo compounds such as azobisisobutyronitrile; and organic peroxides such as benzoyl peroxide, tert-butyl hydroperoxide, and di-tert-butyl peroxide. The photopolymerization initiator used for the radical polymerization is not particularly limited, and examples thereof include benzoin derivatives. Known polymerization initiators used for the living radical polymerization such as ATRP and RAFT can also be used.

The polymerization conditions are not particularly limited and can be suitably adjusted in accordance with an initiator, a boiling point of a solvent, and additionally the kind of monomers to be used.

The addition sequence of monomers is not particularly limited and, for example, the monomers are mixed and the polymerization is initiated in the light of synthesizing a random copolymer, or the monomers are added sequentially to the polymerization system in the light of synthesizing a block copolymer.

[Dispersant]

The dispersant of the present embodiment includes the above copolymer and can also include a solvent and other optional additives as needed. Additionally, the above copolymer is singly used as a dispersant and added to a mixture of the dispersoid and the disperse medium.

The dispersant is used for the purpose of homogeneously dispersing the dispersoid in the disperse medium. With this, the agglomeration and sedimentation of the dispersoid in the mixture of the dispersoid and the disperse medium can be prevented and the stability can be improved, and further the inclusion of a high dispersoid concentration in the disperse medium is enabled and the viscosity of the mixture can also be reduced. Additionally, various effects associated with improved dispersibility of the dispersoid can also be improved.

The dispersant of the present embodiment can disperse the dispersoid by the electrostatic repulsion by the above copolymer, thereby preventing the re-agglomeration of dispersoid particles with each other. The above copolymer can also have a dispersibility improving effect by the steric hindrance repulsion. The dispersoid is not particularly limited, and examples includes those included in the resin composition to be described later.

[Surface Treatment Agent]

The surface treatment agent of the present embodiment includes the above copolymer and can also include a solvent and other optional additives as needed. Additionally, the above copolymer is singly used as a surface treatment agent and coated to the surface of an object and the like.

The surface treatment agent is used for the purpose of modifying the surface characteristics of an object. With this, the affinity and adhesion between an object and other ingredients and further surface characteristics such as smoothness and the like can be modified, and a highly stable coating film is formed on the surface of an object thereby enabling the protection of the object.

The surface treatment agent of the present embodiment treats the object surface with the above copolymer thereby enabling the modification of the affinity and the like between the object and other ingredients via the copolymer. The material to be an object for the surface treatment agent is not particularly limited, and examples thereof include those included in the resin composition to be described later. The size of an object for the surface treatment agent is not particularly limited, and can take wide ranges of objects such as particles having sizes from nano order and micro order to substances having sizes of milli order, centi order, and meter order.

[Dispersion]

The dispersion of the present invention includes the above copolymer, an inorganic filler and can also include a solvent and other optional additives as needed. The dispersion of the present embodiment is the dispersion in which the inorganic fillers and the dispersoid are dispersed by the copolymer and can be used as, for example, a raw material when preparing the resin composition to be described later. Examples of the inorganic filler include those given in the resin composition to be described later.

[Resin Composition]

The resin composition of the present embodiment includes a resin, the above copolymer, and an inorganic filler and can also include a solvent and other optional additives as needed. The resin composition of the present embodiment is the dispersion in which the inorganic fillers and the dispersoid are dispersed in the resin by the copolymer.

The content of the copolymer based on the total amount of the inorganic filler is preferably 0.1 to 5 mass %, and more preferably 0.5 to 4 mass %. When a content of the copolymer based on the total amount of the inorganic filler is 0.5 mass % or more, the dispersibility of the inorganic filler tends to be more improved. When a content of the copolymer based on the total amount of the inorganic filler is 5 mass % or less, the thermal conductive property of the resin composition tends to be more improved.

The inorganic filler is not particularly limited, and examples thereof include inorganic fillers having conductivity and/or thermal conductive property. Examples of such an inorganic filler include one or more powders selected from boron nitride powders, aluminum nitride powders, aluminum oxide powders, silicon nitride powders, silicon oxide powders, magnesium oxide powders, metal aluminum powders, zinc oxide powders, and the like. Of these, aluminum oxide powders and aluminum nitride powders are preferable, with aluminum oxide powders being more preferable. With such an inorganic filler being used, the conductivity and/or thermal conductive property of the resin composition tends to be more improved. With such an inorganic filler and the above copolymer being used in combination, higher filling of the inorganic filler in the resin composition is enabled. With this, the conductivity and/or thermal conductive property improved according to the filler content of the inorganic filler can be even more improved.

The average particle size of the inorganic filler is preferably 0.4 to 120 μm, and more preferably 5 to 80 μm. When an average particle size of the inorganic filler is 0.4 μm or more, the thermal conductive property and oil bleed resistance become good. When such a size is 120 or less, the formability of the composition into which the inorganic filler is filled becomes good.

The inorganic filler can also be a mixture of inorganic fillers having a plurality of average particle sizes. In comparison with the case where only the inorganic filler having a single average particle size is contained, the combination use of an inorganic filler having smaller average particle sizes than this enables the inorganic filler having smaller sizes to fill in gaps of the inorganic filler having larger sizes. For this reason, when inorganic fillers having a plurality of average particle sizes are used in mixture, higher filling of the inorganic fillers to the resin composition is enabled. Typically, when the inorganic fillers are highly filled like this, the viscosity is notably increased, thereby posing problems of causing difficulties in handling and making homogenous dispersion of the inorganic fillers difficult. Contrary to this, when the above copolymer is used, the problems associated with such a high filling can be inhibited. Additionally, with this, the conductivity and/or thermal conductive property improved according to the filler content of the inorganic filler can be even more improved.

The content of the inorganic filler based on the total amount of the resin composition is preferably 80 to 95 mass %, more preferably 80 to 94 mass %, and further preferably 88 to 93 mass %. When a content of the inorganic filler is 80 mass % or more, the conductivity and/or thermal conductive property tends to be more improved. When a content of the inorganic filler is 95 mass % or less, the dispersibility of the inorganic filler in the resin composition becomes good.

The resin is not particularly limited, and examples thereof include thermosetting resins such as silicone resins, epoxy resins, phenolic resins, cyanate reins, melamine resins, urea resins, thermosetting polyimide, and unsaturated polyester resins; thermoplastic resins such as acrylic resins, polyolefin resins, polycarbonate resins, polyester resins, vinyl chloride resins, urethane resins, polyamide resins, and ABS (acrylonitrile-butadiene-styrene) resins. Of these, one or more selected from the group consisting of silicone resins, acrylic resins, and epoxy resins are preferable. When a thermosetting silicone resin is used, for example, the resin is heated at 25° C. to 200° C. for 0.5 hours to 24 hours in advance and can be used as a thermally conductive grease in a state where the crosslinking reaction has proceeded. Alternatively, an electronic component and a heat sink are joined using the composition before hardened, and the composition can be heated under the same conditions and then used.

The optional additives are not particularly limited and examples thereof include silane coupling agents, antioxidants, metal corrosion inhibitors.

The resin composition of the present embodiment can be produced by kneading using a planetary mixer, a universal mixing stirrer, a kneader, a hybrid mixer or the like.

[Thermally Conductive Grease]

The thermally conductive grease of the present embodiment includes the above resin composition. In other words, the thermally conductive grease of the present embodiment includes the resin, the above copolymer, and the inorganic filler and can also include a solvent and other optional additives as needed. The thermally conductive grease of the present embodiment is the dispersion in which the inorganic filler and the dispersoid are dispersed in a base oil by the copolymer.

The content of the copolymer as well as the kind and content of the inorganic filler in the thermally conductive grease can be the same as the above resin composition. The thermally conductive grease of the present embodiment also includes those in which the ingredients in the resin composition are hardened or semi-hardened. For example, the resin composition, heated at 25° C. to 200° C. for 0.5 hours to 24 hours in advance, can be used as a thermally conductive grease in a state where the crosslinking reaction has proceeded.

[Heat Radiation Member]

The heat radiation member of the present embodiment has the above thermally conductive grease, an electronic component, and a heat sink, wherein the electronic component and the heat sink are bonded via the thermally conductive grease.

The electronic component herein is not particularly limited, and examples thereof include heat-generating electronic components such as motors, battery packs, circuit boards used in the in-vehicle power supply system, power transistors, and microprocessors. Of these, electronic components used in an in-vehicle power supply system for vehicles are preferable. The heat sink is not particularly limited as long as it is a part constituted for the purpose of radiating heat or absorbing heat.

The method for bonding an electronic component and a heat sink via the thermally conductive grease is not particularly limited. For example, the heat radiation member can be obtained by bonding an electronic component and a heat sink using the hardened or semi-hardened thermally conductive grease heated in advance, or an electronic component and a heat sink are joined using the thermally conductive grease and then bonded by heating to obtain the heat radiation member. The heating condition is not particularly limited and examples include a condition of 25° C. to 200° C. for 0.5 hours to 24 hours.

EXAMPLES

Hereinafter, the present invention will be described more specifically in reference to Examples and Comparative Examples. The present invention is in no way limited by the following examples.

<Monomers for Preparing Copolymers>

The following raw materials were used for polymerization of the copolymers of Examples.

((Meth)Acrylic Monomer A Having an Anionic Group)

(A-1) Acrylic acid, manufactured by TOAGOSEI CO., LTD.

(A-2) 4-Hydroxyphenyl methacrylate, manufactured by Seiko Chemical Co., Ltd.

(A-3) 2-Methacryloyloxyethyl acid phosphate, "LIGHT ESTER P-1M" manufactured by KYOEISHA CHEMICAL Co., LTD.

(A-4) 2-Acrylamido-2-methylpropanesulfonic acid, manufactured by Tokyo Chemical Industry Co., Ltd.

((Meth)Acrylic Monomer B Having a Cationic Group)

(B-1) 1,2,2,6,6-Pentamethyl-4-piperidyl methacrylate, "ADEKA STAB LA-82" manufactured by ADEKA CORPORATION (B-2) 1-Aminoethyl methacrylate, manufactured by Tokyo Chemical Industry Co., Ltd.

((Meth)Acrylic Monomer C)

(C-1) Butyl acrylate, manufactured by TOAGOSEI CO., LTD.

(C-2) α-Butyl-ω-(3-methacryloxypropyl)polydimethylsiloxane), "Silaplane FM-0721", manufactured by JNC Corporation, weight average molecular weight 5,000

(C-3) α-Butyl-ω-(3-methacryloxypropyl)polydimethylsiloxane), "Silaplane FM-0711", manufactured by JNC Corporation, weight average molecular weight 1,000

(C-4) α-Butyl-ω-(3-methacryloxypropyl)polydimethylsiloxane), "Silaplane FM-0725", manufactured by JNC Corporation, weight average molecular weight 10,000

(C-5) Methoxy polyethylene glycol methacrylate (the number of repeating units of polyethylene glycol is 9), "M-90G" manufactured by SHIN-NAKAMURA CHEMICAL CO, LTD.

<Preparation of Copolymers>

(Copolymer 1)

The preparation of the copolymers was carried out by the following method. First, 100 parts by mass of (meth)acrylic monomers consisting of acrylic acid: 15 mol %, 1,2,2,6,6-pentamethyl-4-piperidyl methacrylate: 0.1 mol %, and butyl acrylate: 84.9 mol % was added to an autoclave with a stirrer. Then, 0.05 parts by mass of azobisisobutyronitrile (manufactured by Tokyo Chemical Industry Co., Ltd.) as an initiator were added to 100 parts by mass in total of (meth)acrylic monomers and 1000 parts by mass of a mixed solution as a solvent having a volume ratio of toluene (guaranteed reagent) to 2-propanol (guaranteed reagent)=7:3 were added, and the autoclave was purged with nitrogen. Subsequently, the autoclave was heated in an oil bath at 65° C. for 20 hours to carry out the radical polymerization. After completion of the polymerization, deaeration was carried out under reduced pressure at 120° C. for 1 hour thereby to obtain Copolymer 1.

A polymerization percentage relative to 100% of the monomer amount charged was 98% or more when analyzed by the gas chromatography analysis. Base on this finding, the ratio of each monomer unit the copolymer had was estimated to be about the same as the monomer ratio charged.

Further, the weight average molecular weight of the obtained Copolymer 1 was determined using the GPC (gel permeation chromatography) method as a weight average molecular weight in term of standard polystyrene. Measurement conditions are as follows.

High-speed GPC device: "HLC-8020" manufactured by TOSOH CORPORATION

Column: 1 column of "TSK guard column MP (×L)" manufactured by TOSOH CORPORATION having 6.0 mm ID×4.0 cm, and 2 columns of "TSK-GELMULTIPOREHXL-M" manufactured by TOSOH CORPORATION having 7.8 mm ID×30.0 cm (number of theoretical plates 16,000 plates), total 3 columns (number of theoretical plates as a whole 32,000 plates)

Eluent: Tetrahydrofuran

Detector: RI (differential refractometer)

(Copolymers 2 to 18)

The radical polymerization was carried out by the same method as in Copolymer 1 in the exception that the monomers having the compositions shown in Tables 1 to 4 were used thereby to obtain Copolymers 2 to 18. The polymerization ratios of the obtained Copolymers 2 to 18 were all 98% or more, and thus the ratio of each monomer unit the copolymer had was estimated to be about the same as the monomer ratio charged. Further, the weight average molecular weight was determined in the same manner as in the above.

The monomer compositions shown in Tables 1 to 4 were described by molar ratio (%). The molar ratio was calculated from the addition amount and molecular weight of each monomer. The molar ratio of α-butyl-ω-(3-methacryloxypropyl) polydimethylsiloxane was calculated based on these weight average molecular weights.

The compositions and weight average molecular weights of Copolymers 1 to 18 synthesized as described above are shown in Tables 1 to 4 below.

<Preparation of Resin (Poly(Butyl Acrylate))>

One-hundred parts by mass of butyl acrylate, 0.05 parts by mass of azobisisobutyronitrile as an initiator and 1000 parts by mass of 2-propanol as a solvent were added into an autoclave with a stirrer, and the autoclave was purged with nitrogen. Subsequently, the autoclave was heated in an oil bath at 75° C. for 20 hours to carry out the radical polymerization. After completion of the polymerization, deaeration was carried out under reduced pressure at 120° C. for 1 hour thereby to obtain poly(butyl acrylate) for preparing a resin.

<Raw Materials for Preparing Resin Compositions>

(Resin)

Poly(butyl acrylate)

Silicone oil: "KF-96-100cs" manufactured by Shin-Etsu Chemical Co., Ltd. (Inorganic filler)

Aluminum oxide, "DAW45" manufactured by Denka Company Limited, average particle size 45 μm, Aluminum oxide, "DAW20" manufactured by Denka Company Limited, average particle size 20 μm, Aluminum oxide, "DAW05" manufactured by Denka Company Limited, average particle size 5 μm, Aluminum oxide, "ASFP40" manufactured by Denka Company Limited, average particle size 0.4 μm, Boron nitride, "SGP" manufactured by Denka Company Limited, average particle size 18 μm The average particle size of the inorganic filler was measured using a "laser diffraction particle size analyzer SALD-20" manufactured by Shimadzu Corporation. For an evaluation sample, 50 ml of pure water and 5 g of the thermally conductive filler to be measured were added to a glass beaker, stirred using a spatula, and subsequently dispersed for 10 minutes in an ultrasonic cleaner. The dispersion of the dispersed thermally conductive filler was added drop by drop using a dropper to a sampler part of the analyzer to carry out the measurement at which an absorbance was stabilized. D50 (median diameter) was employed for the average particle size.

<Preparation of Resin Compositions>

Example 1

Aluminum oxides of 53.5 parts by mass of "DAW45", 4.5 parts by mass of "DAW20", 4.5 parts by mass of "DAW05", and 26.5 parts by mass of "ASFP40" were weighed and added to a universal mixing stirrer with the poly(butyl acrylate): 9.1 parts by mass and Copolymer 1: 1.9 parts by mass prepared earlier. Subsequently, the mixture was vacuum heated and kneaded in the universal mixing stirrer under the condition of 150° C. for 3 hours at an absolute pressure of 100 Pa or less thereby to obtain a resin composition. The evaluations of the obtained resin composition are shown in Table 1.

Examples 2 to 20 and Comparative Examples 1 to 6

The resin compositions were prepared by the same method as in Example 1 in the exception that the composition ingredients shown in Tables 1 to 4 were used. The evaluations of the obtained resin compositions are shown in Tables 1 to 4. In the resin compositions in Comparative Examples 3 to 6, a silane coupling agent was used in place of the copolymer.

The physical properties of the resin compositions were measured by the following methods.

[Viscosity]

In a rotary rheometer MARS III, manufactured by Thermo Scientific, with a 35 mmϕ-parallel plate as the upper jig, the resin composition was placed on a 35 mmϕ-lower plate temperature controllable by a Peltier element, compressed to a thickness of 1 mm by the upper jig, the part stuck out was scraped off, and the measurement was carried out at 25° C. A viscosity at a shear velocity of 1 to 10 $s^{-1}$ was measured, and the viscosity at the shear velocity 10 $s^{-1}$ was used for the evaluation.

When a viscosity is less than 400 Pas, such a composition can be coated by screen printing using a metalmask or a squeegee, thereby being good in the workability. When a viscosity is 400 Pas or more and less than 700 Pas, such a composition is not suitable for screen printing using a metal mask and a squeegee, but suitable for being discharged and coated from a syringe of an automatic coating equipment. When a viscosity is 400 Pas or more and less than 1150 Pas, such a composition can be discharged and coated by an automatic coating equipment but needs more time. With a viscosity of 1150 Pas or more, discharging or coating by an automatic coating equipment needs time thereby making it difficult, or discharging or coating by an automatic coating equipment is not feasible.

[Crack Resistance]

A sample, which was obtained by preparing two 76 mm-square non-alkali glass plates, coating the resin composition at the center of one of the glass plates in such a way as to have a diameter of 20 mm and a thickness of 1 mm, interposing the composition with the other glass plate, was retained under the environment of 150° C., and a heat resistance test was carried out. After 24 hour-retention, the presence or absence of cracks was visually confirmed.

Figure 2:
FIG. 2 is a binarized image of the photograph of the test piece in FIG. 1.

FIG. 1 shows a photograph of the test piece after the crack resistance evaluation test of Comparative Example 3, and FIG. 2 shows a binarized image of the image data of the test piece using an image processing software (GIMP2.0) after the crack resistance evaluation test of Comparative Example 3. In the binarized image, the black parts show the gaps caused by cracks of the resin composition, and the white parts show the parts where the resin composition exists. An image binarized like this for each of Examples and Comparative Examples was created, and a crack resistance rate was calculated based on the image. More specifically, an area ratio of the black parts was calculated from the entire area and defined as a crack rate. The evaluation criteria for the crack resistance are shown below.

A: Crack rate of 0% or more and less than 1%

B: Crack rate of 1% or more and less than 5%

C: Crack rate of 5% or more and less than 15%

D: Crack rate of 15% or more

[Bleed-Out Resistance]

Figure 3:
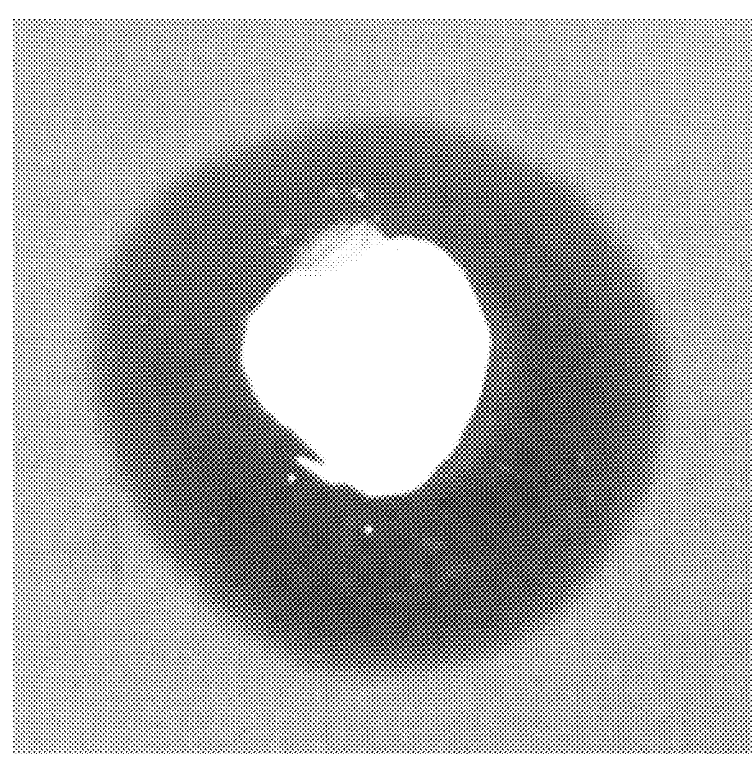
FIG. 3 is a photograph showing the test result of the total amount of bleeding in the bleed-out resistance in Comparative Example.

On a 76 mm-square frosted glass, 0.65 g of the resin composition was coated in a substantially circular shape. The coated glass was allowed to stand for 24 hours in an oven at 150° C., and then taken out of the oven. FIG. 3 is a photograph showing the test result of the total amount of bleeding of Comparative Example 3 after taken out of the oven. As shown in FIG. 3, it is revealed that the liquid ingredients seeped out and formed a gray circle around the white resin composition at the center of the photograph. The thus seeped-out liquid ingredient is called bleeding. Using the size of this circle as the indicator for a bleeding amount, the maximum length from the edge part of the white resin composition to the edge of the gray circle was defined as the bleed-out amount and evaluated.

[Thermal Conductivity]

The resin composition was interposed between a cuboidal copper jig with an embedded heater and having an end of 100 mm$^2$ (10 mm×10 mm) and a cuboidal copper jig equipped with a cooling fin and having an end of 100 mm$^2$ (10 mm×10 mm), and a thermal resistance was measured with a gap thickness ranging from 0.05 mm to 0.30 mm, thereby calculating a thermal conductivity from the thermal resistance and the thickness gradient to be evaluated. The thermal resistance was calculated by retaining electricity of 10 W applied to the heater for 30 minutes, measuring a temperature difference (° C.) between the copper jigs, and using thermal resistance (° C./W)={temperature difference (° C.)/electricity (W)}.

The thermal conductivity of 1 W/mK or more can be used with no problem for the use as a thermally conductive grease.

For the evaluation, the following indicators were used.

Very good: thermal conductivity of 2.0 W/mK or more

Good: thermal conductivity of 1.0 W/mK or more and less than 2.0 W/mK

Poor: thermal conductivity of less than 1.0 W/mK

TABLE 1

| | | | | | Example | | | | | Comparative Example | | |
|---|---|---|---|---|---|---|---|---|---|---|---|---|
| | | | | | 1 | 2 | 3 | 4 | 5 | 1 | 2 | 5 |
| Copolymer | Unit A | (A-1) | Acrylic acid | Mol % | 15 | 5 | 2 | 0.1 | 0.1 | 15 | — | — |
| | | (A-2) | 4-Hydroxyphenyl methacrylate | | — | — | — | — | — | — | — | — |
| | | (A-3) | 2-Methacryloyloxyethyl acid phosphate | | — | — | — | — | — | — | — | — |
| | | (A-4) | 2-Acrylamido-2-methylpropanesulfonic acid | | — | — | — | — | — | — | — | — |
| | Unit B | (B-1) | 1,2,2,6,6-Pentamethyl-4-piperidyl methacrylate | | 0.1 | 0.1 | 0.5 | 0.1 | 5 | — | 2 | — |
| | Unit C | (C-1) | Butyl acrylate | | 84.9 | 94.9 | 97.5 | 99.8 | 94.9 | 85 | 98 | — |
| | | (C-2) | α-Butyl-ω-(3-methacryloxypropyl)polydimethylsiloxane | | — | — | — | — | — | — | — | — |
| | | | Copolymer No. | | 1 | 2 | 3 | 4 | 5 | 13 | 14 | |
| | | | Weight average molecular weight | | 8000 | 7500 | 7000 | 6500 | 6800 | 8000 | 7500 | — |
| Resin composition | Resin type | | Copolymer | Mass % | 1.9 | 1.9 | 1.9 | 1.9 | 1.9 | 1.9 | 1.9 | — |
| | | | Poly(butyl acrylate) | | 9.1 | 9.1 | 9.1 | 9.1 | 9.1 | 9.1 | 9.1 | 9.1 |
| | | | Silicone oil | | — | — | — | — | — | — | — | — |
| | Inorganic filler | | Aluminum oxide (average particle size: 45 μm) | | 53.5 | 53.5 | 53.5 | 53.5 | 53.5 | 53.5 | 53.5 | 53.5 |
| | | | Aluminum oxide (average particle size: 20 μm) | | 4.5 | 4.5 | 4.5 | 4.5 | 4.5 | 4.5 | 4.5 | 4.5 |
| | | | Aluminum oxide (average particle size: 5 μm) | | 4.5 | 4.5 | 4.5 | 4.5 | 4.5 | 4.5 | 4.5 | 4.5 |
| | | | Aluminum oxide (average particle size: 0.4 μm) | | 26.5 | 26.5 | 26.5 | 26.5 | 26.5 | 26.5 | 26.5 | 26.5 |
| | | | Boron nitride (average particle size: 18 μm) | | — | — | — | — | — | — | — | — |
| | Silane coupling agent | | n-Decyltrimethoxysilane | | — | — | — | — | — | — | — | 1.9 |
| | | | Viscosity of resin composition | Pa · s | 1100 | 950 | 800 | 780 | 950 | 1200 | 1200 | 850 |
| | | | Crack resistance | | A | A | A | A | A | B | B | D |
| | | | Bleed-out resistance | mm | 0.5 | 0.5 | 0.5 | 0.5 | 0.5 | 0.5 | 0.5 | 2 |
| | | | Thermal conductivity | W/mK | 2.3 | 2.3 | 2.3 | 2.3 | 2.3 | 2.1 | 2.1 | 2.6 |

TABLE 2

| | | | | | Example | | | | | | | Comparative Example |
|---|---|---|---|---|---|---|---|---|---|---|---|---|
| | | | | | 6 | 7 | 8 | 9 | 10 | 11 | 12 | 6 |
| Copolymer | Unit A | (A-1) | Acrylic acid | Mol % | 15 | 5 | 0.5 | 0.1 | — | — | — | — |
| | | (A-2) | 4-Hydroxyphenyl methacrylate | | — | — | — | — | 0.5 | — | — | — |
| | | (A-3) | 2-Methacryloyloxyethyl acid phosphate | | — | — | — | — | — | 0.5 | — | — |

TABLE 2-continued

| | | | | | Example | | | | | | | Comparative Example |
|---|---|---|---|---|---|---|---|---|---|---|---|---|
| | | | | | 6 | 7 | 8 | 9 | 10 | 11 | 12 | 6 |
| | | (A-4) | 2-Acrylamido-2-methylpropanesulfonic acid | | — | — | — | — | — | — | 0.5 | — |
| | Unit B | (B-1) | 1,2,2,6,6-Pentamethyl-4-piperidyl methacrylate | | 0.1 | 0.1 | 0.5 | 5 | 0.5 | 0.5 | 0.5 | — |
| | Unit C | (C-1) | Butyl acrylate | | 84.9 | 94.9 | 99 | 94.9 | 99 | 99 | 99 | — |
| | | (C-2) | α-Butyl-ω-(3-methacryloxypropyl)polydimethylsiloxane | | — | — | — | — | — | — | — | — |
| | | | Copolymer No. | | 1 | 2 | 6 | 5 | 7 | 8 | 9 | |
| | | | Weight average molecular weight | | 8000 | 7500 | 8000 | 6800 | 6800 | 6800 | 6800 | — |
| Resin composition | Resin type | | Copolymer | Mass % | 1.0 | 1.0 | 1.0 | 1.0 | 1.0 | 1.0 | 1.0 | — |
| | | | Poly(butyl acrylate) | | 48.0 | 48.0 | 48.0 | 48.0 | 48.0 | 48.0 | 48.0 | 48.0 |
| | | | Silicone oil | | — | — | — | — | — | — | — | — |
| | Inorganic filler | | Aluminum oxide (average particle size: 45 μm) | | — | — | — | — | — | — | — | — |
| | | | Aluminum oxide (average particle size: 20 μm) | | — | — | — | — | — | — | — | — |
| | | | Aluminum oxide (average particle size: 5 μm | | — | — | — | — | — | — | — | — |
| | | | Aluminum oxide (average particle size: 0.4 μm) | | — | — | — | — | — | — | — | — |
| | | | Boron nitride (average particle size: 18 μm) | | 51.0 | 51.0 | 51.0 | 51.0 | 51.0 | 51.0 | 51.0 | 51.0 |
| | Silane coupling agent | | n-Decyltrimethoxysilane | | — | — | — | — | — | — | — | 1.0 |
| | | | Viscosity of resin composition | Pa · s | 180 | 120 | 120 | 160 | 140 | 160 | 180 | 150 |
| | | | Crack resistance | | A | A | A | A | A | A | A | C |
| | | | Bleed-out resistance | mm | 1.5 | 1.5 | 1.5 | 1.5 | 1.5 | 1.5 | 1.5 | 3 |
| | | | Thermal conductivity | W/mK | 1.0 | 1.0 | 1.0 | 1.0 | 1.0 | 1.0 | 1.0 | 0.8 |

TABLE 3

| | | | | | Example | | | | Comparative Example | |
|---|---|---|---|---|---|---|---|---|---|---|
| | | | | | 13 | 14 | 15 | 16 | 3 | 4 |
| Copolymer | Unit A | (A-1) | Acrylic acid | Mol % | 15 | 15 | 15 | 68 | — | — |
| | | (A-2) | 4-Hydroxyphenyl methacrylate | | — | — | — | — | — | — |
| | | (A-3) | 2-Methacryloyloxyethyl acid phosphate | | — | — | — | — | — | — |
| | | (A-4) | 2-Acrylamido-2-methylpropanesulfonic acid | | — | — | — | — | — | — |
| | Unit B | (B-1) | 1,2,2,6,6-Pentamethyl-4-piperidyl methacrylate | | 2 | 2 | 0.5 | 2 | — | — |
| | Unit C | (C-1) | Butyl acrylate | | — | — | — | — | — | — |
| | | (C-2) | α-Butyl-ω-(3-methacryloxypropyl)polydimethylsiloxane | | 83 | 83 | 84.5 | 30 | — | — |
| | | | Copolymer No. | | 10 | 10 | 11 | 12 | | |
| | | | Weight average molecular weight | | 20000 | 20000 | 19000 | 60000 | — | — |
| Resin composition | Resin type | | Copolymer | Mass % | 1.8 | 1.9 | 1.9 | 1.9 | — | — |
| | | | Poly(butyl acrylate) | | — | — | — | — | — | — |
| | | | Silicone oil | | 9.6 | 4.2 | 4.2 | 4.2 | 9.6 | 4.2 |
| | Inorganic filler | | Aluminum oxide (average particle size: 45 μm) | | 53.2 | 56.3 | 56.3 | 56.3 | 53.2 | 56.3 |
| | | | Aluminum oxide (average particle size: 20 μm) | | 4.4 | 4.7 | 4.7 | 4.7 | 4.4 | 4.7 |
| | | | Aluminum oxide (average particle size: 5 μm) | | 4.4 | 4.7 | 4.7 | 4.7 | 4.4 | 4.7 |
| | | | Aluminum oxide (average particle size: 0.4 μm) | | 26.6 | 28.2 | 28.2 | 28.2 | 26.6 | 28.2 |
| | | | Boron nitride (average particle size: 18 μm) | | — | — | — | — | — | — |
| | Silane coupling agent | | n-Decyltrimethoxysilane | | — | — | — | — | 1.8 | 1.9 |
| | | | Viscosity of resin composition | Pa · s | 150 | 650 | 600 | 600 | 150 | 700 |
| | | | Crack resistance | | A | A | A | A | C | D |
| | | | Bleed-out resistance | mm | 1.5 | 0.5 | 0.5 | 0.5 | 6 | 2 |
| | | | Thermal conductivity | W/mK | 2.2 | 4.7 | 4.7 | 4.7 | 2.0 | 4.0 |

TABLE 4

| | | | | | Example | | | |
|---|---|---|---|---|---|---|---|---|
| | | | | | 17 | 18 | 19 | 20 |
| Copolymer | Unit A | (A-1) | Acrylic acid | Mol % | 2 | 15 | 15 | 2 |
| | | (A-2) | 4-Hydroxyphenyl methacrylate | | — | — | — | — |
| | | (A-3) | 2-Methacryloyloxyethyl acid phosphate | | — | — | — | — |
| | | (A-4) | 2-Acrylamido-2-methylpropanesulfonic acid | | — | — | — | — |
| | Unit B | (B-1) | 1,2,2,6,6-Pentamethyl-4-piperidyl methacrylate | | — | 2 | 2 | 0.5 |
| | | (B-2) | 1-Aminoethyl methacrylate | | 0.5 | — | — | — |
| | Unit C | (C-1) | Butyl acrylate | | 97.5 | — | — | — |
| | | (C-2) | α-Butyl-ω-(3-methacryloxypropyl)polydimethylsiloxane (Mw = 5,000) | | — | — | — | — |
| | | (C-3) | α-Butyl-ω-(3-methacryloxyproyl)polydimethylsiloxane (Mw = 1,000) | | — | 83 | — | — |
| | | (C-4) | α-Butyl-ω-(3-methacryloxypropyl)polydimethylsiloxane (Mw = 10,000) | | — | — | 83 | — |
| | | (C-5) | Methoxy polyethylene glycol methacrylate (n = 9) | | — | — | — | 97.5 |
| | | | Copolymer No. | | 15 | 16 | 17 | 18 |
| | | | Weight average molecular weight | | 6400 | 17000 | 28000 | 7400 |
| Resin composition | Resin type | | Copolymer | Mass % | 1.9 | 1.9 | 1.9 | 1.9 |
| | | | Poly(butyl acrylate) | | 9.1 | 9.1 | 9.1 | 9.1 |
| | | | Silicone oil | | — | — | — | — |
| | Inorganic filler | | Aluminum oxide (average particle size: 45 μm) | | 53.5 | 53.5 | 53.5 | 53.5 |
| | | | Aluminum oxide (average particle size: 20 μm) | | 4.5 | 4.5 | 4.5 | 4.5 |
| | | | Aluminum oxide (average particle size: 5 μm) | | 4.5 | 4.5 | 4.5 | 4.5 |
| | | | Aluminum oxide (average particle size: 0.4 μm) | | 26.5 | 26.5 | 26.5 | 26.5 |
| | | | Boron nitride (average particle size: 18 μm) | | — | — | — | — |
| | Silane coupling agent | | n-Decyltrimethoxysilane | | — | — | — | — |
| | | | Viscosity of resin composition | Pa · s | 760 | 830 | 1400 | 960 |
| | | | Crack resistance | | A | A | A | A |
| | | | Bleed-out resistance | mm | 0.5 | 0.5 | 0.5 | 0.5 |
| | | | Thermal conductivity | W/mK | 2.5 | 2.5 | 2.5 | 2.5 |

INDUSTRIAL APPLICABILITY

The copolymer of the present invention has industrial applicability to dispersants and surface treatment agents, and resin compositions and the like using these.

The invention claimed is:

1. A copolymer consisting of:
a (meth)acrylic monomer unit A having an anionic group;
a (meth)acrylic monomer unit B having a cationic group; and
a (meth)acrylic monomer unit C other than the (meth) acrylic monomer unit A and the (meth)acrylic monomer unit B, wherein the (meth)acrylic monomer unit C comprises one or more selected from the group consisting of oxyalkylene skeletons, siloxane skeletons, and phosphodiester skeletons,
wherein:
a content of the (meth)acrylic monomer unit A is from 0.03 to 70 mol % based on a total of 100 mol % of the (meth)acrylic monomer unit A, the (meth)acrylic monomer unit B, and the (meth)acrylic monomer unit C;
a content of the (meth)acrylic monomer unit B is from 0.02 to 20 mol % based on a total of 100 mol % of the (meth)acrylic monomer unit A, the (meth)acrylic monomer unit B, and the (meth)acrylic monomer unit C;
a content of the (meth)acrylic monomer unit C is from 30 to 99.8 mol % based on a total of 100 mol % of the (meth)acrylic monomer unit A, the (meth)acrylic monomer unit B, and the (meth)acrylic monomer unit C; and
the copolymer has a weight-average molecular weight of from 5,000 to 500,000 g/mol.

2. The copolymer according to claim 1, wherein the anionic group comprises one or more selected from the group consisting of carboxyl groups, phosphate groups, and phenolic hydroxyl groups.

3. The copolymer according to claim 1, wherein the (meth)acrylic monomer unit A further comprises an electron-withdrawing group bound to the anionic group.

4. The copolymer according to claim 1, wherein the cationic group comprises one or more selected from the group consisting of primary amino groups, secondary amino groups, tertiary amino groups, and quaternary ammonium salts.

5. The copolymer according to claim 1, wherein the (meth)acrylic monomer unit B further comprises an electron-donating group bound to the cationic group.

6. The copolymer according to claim 1, wherein a total content of the (meth)acrylic monomer unit A and the (meth) acrylic monomer unit B is 0.2 to 70 mol % based on a total 100 mol % of the (meth)acrylic monomer unit A, the (meth)acrylic monomer unit B, and the (meth)acrylic monomer unit C.

7. The copolymer according to claim 1, wherein a content of the (meth)acrylic monomer unit A is 0.1 to 68 mol % based on a total 100 mol % of the (meth)acrylic monomer unit A, the (meth)acrylic monomer unit B, and the (meth) acrylic monomer unit C.

8. The copolymer according to claim 1, wherein a content of the (meth)acrylic monomer unit B is 0.1 to 5 mol % based on a total 100 mol % of the (meth)acrylic monomer unit A, the (meth)acrylic monomer unit B, and the (meth)acrylic monomer unit C.

9. The copolymer according to claim 1, wherein a content of the (meth)acrylic monomer unit C is 83 to 99.8 mol % based on a total 100 mol % of the (meth)acrylic monomer unit A, the (meth)acrylic monomer unit B, and the (meth) acrylic monomer unit C.

10. The copolymer according to claim 1, wherein a molar ratio of the (meth)acrylic monomer unit A to the (meth) acrylic monomer unit B is 0.9 to 30.

11. A dispersant comprising the copolymer according to claim 1.

12. A surface treatment agent comprising the copolymer according to claim 1.

13. A dispersion comprising the copolymer according to claim 1 and an inorganic filler.

14. A resin composition comprising a resin, the copolymer according to claim 1, and an inorganic filler.

15. The resin composition according to claim 14, wherein the inorganic filler has conductivity and/or thermal conductive property.

16. The resin composition according to claim 14, wherein the inorganic filler is one or more selected from the group consisting of boron nitride powders, aluminum nitride powders, aluminum oxide powders, silicon nitride powders, silicon oxide powders, magnesium oxide powders, metal aluminum powders, and zinc oxide powders.

17. The resin composition according to claim 14, wherein the resin comprises one or more selected from the group consisting of silicone resins, acrylic resins, and epoxy resins.

18. A thermally conductive grease comprising the resin composition according to claim 14.

19. A heat radiation member comprising the thermally conductive grease according to claim 18, an electronic component, and a heat sink, wherein the electronic component and the heat sink are bonded via the thermally conductive grease.

* * * * *